US011443155B2

(12) United States Patent
Lindsey et al.

(10) Patent No.: US 11,443,155 B2
(45) Date of Patent: Sep. 13, 2022

(54) INSULATOR LEAKAGE CURRENT DETECTOR AND METHOD OF DETECTING INSULATOR LEAKAGE CURRENT

(71) Applicant: LINDSEY MANUFACTURING CO., Azusa, CA (US)

(72) Inventors: Keith E. Lindsey, La Canada, CA (US); John McCall, Rancho Cucamonga, CA (US)

(73) Assignee: Lindsey Manufacturing Company, Azusa, CA (US)

( * ) Notice: Subject to any disclaimer, the term of this patent is extended or adjusted under 35 U.S.C. 154(b) by 0 days.

(21) Appl. No.: 16/253,880

(22) Filed: Jan. 22, 2019

(65) Prior Publication Data

US 2019/0227110 A1    Jul. 25, 2019

Related U.S. Application Data

(60) Provisional application No. 62/619,619, filed on Jan. 19, 2018.

(51) Int. Cl.
*G06K 19/07* (2006.01)
*G01R 15/18* (2006.01)
(Continued)

(52) U.S. Cl.
CPC ....... *G06K 19/0723* (2013.01); *G01R 15/181* (2013.01); *G01R 31/085* (2013.01);
(Continued)

(58) Field of Classification Search
CPC ........ G01R 31/50; G01R 31/52; G01R 31/28; G01R 31/085; G01R 31/1272;
(Continued)

(56) References Cited

U.S. PATENT DOCUMENTS 4,829,298 A * 5/1989 Fernandes ............ G01R 15/142
340/870.27
4,855,671 A * 8/1989 Fernandes .............. G01K 1/024
324/127

(Continued)

FOREIGN PATENT DOCUMENTS

AU    2017245416 A1 *  5/2018    ........... G01R 31/025
AU    2017245416 B2 *  1/2019    ........... G01R 31/025

(Continued)

OTHER PUBLICATIONS

JPH0789710B2 English Translation (Year: 2021).*
(Continued)

*Primary Examiner* — Patrick Assouad
*Assistant Examiner* — Sean Curtis
(74) *Attorney, Agent, or Firm* — Lewis Roca Rothgerber Christie LLP

(57) ABSTRACT

An insulator leakage current detector, an insulator leakage current detecting system, and a method of monitoring insulator leakage current using the same are provided. An insulator leakage current detector mountable on an insulator string includes a sensor to sense leakage current information of the insulator string; and a device to send a signal including the leakage current information sensed by the sensor.

14 Claims, 2 Drawing Sheets

(51) Int. Cl.
*G01R 31/12* (2020.01)
*G01R 31/08* (2020.01)
*G01R 31/52* (2020.01)

(52) U.S. Cl.
CPC ......... *G01R 31/1272* (2013.01); *G01R 31/52* (2020.01); *G06K 19/0715* (2013.01); *G06K 19/0716* (2013.01)

(58) Field of Classification Search
CPC ............. G01R 15/181; G06K 19/0715; G06K 19/0716; G06K 19/0723
USPC ........................................ 324/509, 541, 544
See application file for complete search history.

(56) References Cited

U.S. PATENT DOCUMENTS

| | | | | |
|---|---|---|---|---|
| 4,904,996 | A * | 2/1990 | Fernandes | G01R 15/142 340/870.07 |
| 5,550,476 | A * | 8/1996 | Lau | G01R 15/142 324/522 |
| 5,565,783 | A * | 10/1996 | Lau | G01R 31/50 324/543 |
| 5,973,501 | A * | 10/1999 | Reichard | G01R 23/20 324/253 |
| 6,205,867 | B1 * | 3/2001 | Hayes | G01C 9/00 73/862.391 |
| 6,366,076 | B1 * | 4/2002 | Karrer | G01R 15/181 324/117 R |
| 7,369,045 | B2 * | 5/2008 | Hansen | H02J 13/00034 340/538.16 |
| 7,557,563 | B2 * | 7/2009 | Gunn | G01R 15/183 324/117 H |
| 8,456,168 | B2 * | 6/2013 | Hyde | G01R 31/1272 324/543 |
| 8,744,790 | B2 * | 6/2014 | Lancaster | G01R 21/06 702/64 |
| 9,261,549 | B2 * | 2/2016 | Phillips | G01R 15/186 |
| 9,518,889 | B2 * | 12/2016 | Masuda | G01M 3/18 |
| 9,535,105 | B2 * | 1/2017 | Phillips | G01R 31/1245 |
| 9,983,254 | B2 * | 5/2018 | McCammon | H02N 2/181 |
| 10,031,889 | B2 * | 7/2018 | Spillane | G01B 17/00 |
| 10,161,987 | B2 * | 12/2018 | Yamaji | G01R 31/1245 |
| 10,205,307 | B2 * | 2/2019 | Lancaster | H02J 13/0006 |
| 10,274,531 | B2 * | 4/2019 | Mesples | H02G 7/00 |
| 2005/0017751 | A1 * | 1/2005 | Gunn | G01R 15/142 324/764.01 |
| 2008/0024321 | A1 * | 1/2008 | Polk | H04L 12/66 340/870.07 |
| 2009/0015239 | A1 * | 1/2009 | Georgiou | G01R 15/14 324/105 |
| 2009/0187285 | A1 * | 7/2009 | Yaney | G08B 25/06 700/292 |
| 2011/0010118 | A1 * | 1/2011 | Gaarder | G01R 21/133 702/60 |
| 2011/0101989 | A1 * | 5/2011 | Hyde | G01R 31/1245 324/543 |
| 2011/0288799 | A1 * | 11/2011 | Cortes | G01R 33/072 702/65 |
| 2013/0169285 | A1 * | 7/2013 | Phillips | G01R 15/186 324/509 |
| 2013/0169286 | A1 * | 7/2013 | Phillips | G01R 15/14 324/509 |
| 2014/0125354 | A1 * | 5/2014 | Mason | G01R 21/06 324/601 |
| 2015/0168472 | A1 * | 6/2015 | Phillips | G01R 31/1245 324/551 |
| 2016/0018455 | A1 * | 1/2016 | Phillips | G01R 31/52 324/551 |
| 2016/0209445 | A1 * | 7/2016 | McCammon | G01R 1/07 |
| 2016/0209454 | A1 * | 7/2016 | McCammon | G01R 1/07 |
| 2017/0030955 | A1 * | 2/2017 | McCammon | G01R 31/08 |
| 2017/0030956 | A1 * | 2/2017 | McCammon | H02N 2/181 |
| 2017/0146588 | A1 * | 5/2017 | Yamaji | G01R 31/52 |
| 2018/0106846 | A1 * | 4/2018 | Mesples | H02G 7/00 |
| 2018/0113161 | A1 * | 4/2018 | Hines | G01R 15/144 |
| 2019/0227110 | A1 * | 7/2019 | Lindsey | G01R 15/181 |
| 2020/0018787 | A1 * | 1/2020 | Lindsey | G01R 19/00 |

FOREIGN PATENT DOCUMENTS

| | | | | |
|---|---|---|---|---|
| CA | 2858407 | A1 * | 7/2013 | ........... G01R 15/186 |
| CA | 2873500 | A1 * | 6/2015 | ........... G01R 31/025 |
| CA | 2873500 | C * | 4/2018 | ........... G01R 31/025 |
| CN | 102236056 | A * | 11/2011 | |
| CN | 103869165 | A * | 6/2014 | |
| CN | 104316851 | A * | 1/2015 | |
| CN | 104764983 | A * | 7/2015 | |
| CN | 204631106 | U * | 9/2015 | |
| CN | 205246127 | U * | 5/2016 | |
| CN | 205301474 | U * | 6/2016 | |
| CN | 106646001 | A * | 5/2017 | |
| CN | 206514883 | U * | 9/2017 | |
| CN | 206515402 | U * | 9/2017 | |
| CN | 107958755 | A * | 4/2018 | ........... G01R 31/025 |
| CN | 108107330 | A * | 6/2018 | |
| CN | 207817103 | U * | 9/2018 | |
| CN | 207851216 | U * | 9/2018 | ........ G01R 19/16538 |
| CN | 207851218 | U * | 9/2018 | |
| CN | 207866878 | U * | 9/2018 | |
| CN | 208076652 | U * | 11/2018 | |
| CN | 208206203 | U * | 12/2018 | |
| CN | 105158630 | B * | 1/2019 | |
| CN | 111238636 | B * | 9/2019 | |
| CN | 209402433 | U * | 9/2019 | |
| CN | 212567729 | U * | 2/2021 | |
| CN | 111238636 | B * | 9/2021 | ................ G01J 1/42 |
| EP | 2884292 | A1 * | 6/2015 | ........... G01R 31/025 |
| EP | 2884292 | B1 * | 8/2016 | ........... G01R 31/025 |
| EP | 2798359 | B1 * | 3/2019 | ........... G01R 15/186 |
| JP | H0789710 | B2 * | 9/1995 | |
| JP | H0789710 | B2 * | 1/2015 | |
| KR | 101034131 | B1 * | 5/2011 | |
| WO | WO-2012044354 | A2 * | 4/2012 | ........ G01R 31/1245 |
| WO | WO-2013102040 | A1 * | 7/2013 | ........... G01R 15/186 |

OTHER PUBLICATIONS

Oliveira et al., Real-Time Monitoring of the Leakage Current of 230-kV Glass-Type Insulators During Washing. IEEE Transactions on Power Delivery, vol. 24, No. 4, Oct. 2009 (Year: 2009).*

Tingtao et al., On-line Monitoring System of Insulator Leakage Current Based on ARM. © 2012 IEEE (Year: 2012).*

Wang et al., Leakage Current Response Mechanism of Insulator String With Ambient Humidity on Days Without Rain. vol. 7, 2019 of IEEE Access. (Year: 2019).*

Su et al., Evaluation of Insulator String's Icing Status Based on Leakage Current. XVII International Symposium on High Voltage Engineering, Hannover, Germany, Aug. 22-26, 2011 (Year: 2011).*

Roman et al., In-Situ Monitoring of Leakage Current on Composite and Glass Insulators of the Cahora Bassa HVDC Transmission Line. South African Institute of Electrical Engineers—vol. 110 (1) Mar. 2019 (Year: 2019).*

Amin et al., Monitoring of Leakage Current for Composite Insulators and Electrical Devices. © 2009 Advanced Study Center Co. Ltd. (Year: 2009).*

CN104316851A English translation (Year: 2021).*

* cited by examiner

INSULATOR LEAKAGE CURRENT DETECTOR AND METHOD OF DETECTING INSULATOR LEAKAGE CURRENT

CROSS-REFERENCE TO RELATED APPLICATION

This application claims the benefit of U.S. Provisional Patent Application Ser. No. 62/619,619, filed on Jan. 19, 2018, the entire content of which is hereby incorporated by reference.

FIELD

Aspects of embodiments of the present invention relate to an insulator leakage current detector, an insulator leakage current detecting system, and a method of monitoring insulator leakage current using the same.

BACKGROUND

When a string of insulators supporting a transmission line get contaminated with dirt etc., and particularly when the weather is humid, the insulator string may conduct electricity along the insulator string to ground, i.e. a tower. This current "leaks" along the surface of the insulators. If the current reaches a certain level, it raises the temperature of areas along the insulator string which dries out the humidity or moisture on the insulators. This results in a "dry band." The electric current will jump the dry band, causing an arc. If this activity continues, a flashover of the entire string of insulators may result.

As such, it is desirable for utility providers to know about the leakage current before the insulators flash over. A conventional practice is for the utility providers to high-pressure wash the insulators on a regular basis to remove the dirt and contamination from the surface of the insulators. This is a costly and inefficient process, as the washing may occur too often or not often enough. A system and process to measure and yield a periodic or real time leakage current of an insulator string would be desirable for utility providers. Conventional devices for measuring leakage current may be located at the tower end of an insulator string. However, this practice is susceptible to the capacitance coupling between the grounded tower and the insulators with metal caps, which increases the current at the grounded end, thereby interfering with the detection of a threshold point. Additionally, conventional devices for measuring leakage current may require batteries and/or a tower mounted radio, which can lead to maintenance issues and vandalism problems.

SUMMARY

According to an aspect of embodiments of the present invention, an insulator leakage current detector measures current at a distance from the tower end of the insulator string (e.g., one or more insulators removed from the tower end) to detect the leakage current without interference of capacitance coupling. According to one or more embodiments, the current is measured on or below the third insulator from the bottom of the insulator string.

According to another aspect of embodiments of the present invention, an insulator leakage current detector includes a Rogowski coil configured to be installed on the insulator string via a hot stick and also configured to operate with low or minimal maintenance.

According to another aspect of embodiments of the present invention, an insulator leakage current detector includes an RFID chip which does not require power to operate, thereby reducing maintenance costs. The RFID chip may be pinged by an RFID transceiver located in the vicinity of the insulator leakage current detector.

According to another aspect of embodiments of the present invention, the receiving device, such as a transmission line monitor, can send information to a utility provider to monitor the insulators and the leakage current.

According to another aspect of embodiments of the present invention, a receiving device can compute the insulator leakage current, such as when humidity is low and when humidity is high (e.g., early morning near the ocean), and send a signal or data to a remote monitoring station. Accordingly, it may be determined that the insulators need to be washed.

According to another aspect of embodiments of the present invention, communication of insulator leakage current information to the remote monitoring station may occur via an iridium satellite or radio.

According to one or more embodiments, an insulator leakage current detector mountable on an insulator string includes a sensor to sense leakage current information of the insulator string; and a device to send a signal including the leakage current information sensed by the sensor.

In one or more embodiments, the sensor includes a Rogowski coil.

In one or more embodiments, the device to send the signal including the leakage current information includes an RFID sensor.

According to one or more embodiments, an insulator leakage current detecting system includes: an insulator leakage current detector mountable on an insulator string and including: a sensor to sense leakage current information of the insulator string; and a device to send a signal including the leakage current information sensed by the sensor; and a receiving device to receive the signal including the leakage current information.

In one or more embodiments, the sensor includes a Rogowski coil.

In one or more embodiments, the device to send the signal including the leakage current information includes an RFID sensor, and the receiving device includes an RFID transceiver.

In one or more embodiments, the receiving device includes a transmission line monitor mounted on a transmission line, the transmission line being supported by the insulator string.

In one or more embodiments, the insulator leakage current detector does not have a power source separate from any power source of the receiving device.

In one or more embodiments, the insulator leakage current detecting system further includes a remote monitoring device to which the receiving device is configured to send leakage current data.

In one or more embodiments, the insulator leakage current detector is mounted at an end of the insulator string opposite a ground.

According to one or more embodiments, a method of detecting an insulator leakage current includes: providing an insulator leakage current detector on an insulator string; sensing leakage current information using a sensor of the leakage current detector; and transmitting a signal including the leakage current information to a receiving device.

In one or more embodiments, transmitting the signal including the leakage current information includes transmitting the signal from an RFID sensor to an RFID transceiver.

In one or more embodiments, the method further includes calculating a leakage current based on the leakage current information, and transmitting the calculated leakage current to a remote monitoring station.

In one or more embodiments, the leakage current information is a derivative of the leakage current, and the method further includes integrating the derivative of the leakage current to obtain the leakage current.

BRIEF DESCRIPTION OF THE DRAWINGS

The above and other features, aspects, and advantages of the present invention will become better understood with regard to the following description and accompanying drawings where.

DETAILED DESCRIPTION

In the following detailed description, certain exemplary embodiments of the present invention are shown and described, by way of illustration. As those skilled in the art would recognize, the described exemplary embodiments may be modified in various ways without departing from the spirit and scope of the present invention. Accordingly, the drawings and description are to be regarded as illustrative in nature, rather than restrictive.

Figure 1:
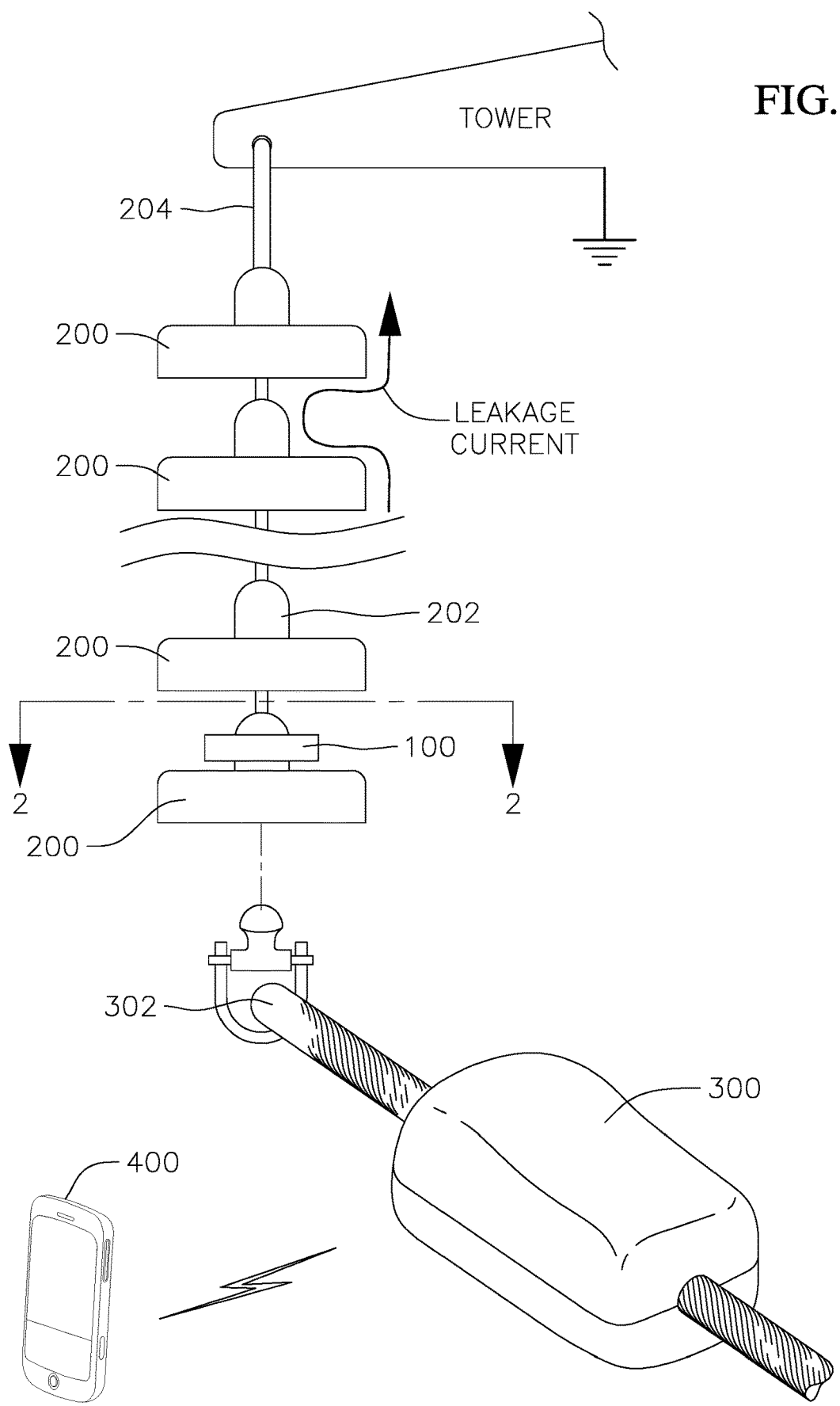
FIG. 1 is a schematic view of a string of insulators, an insulator leakage current detector, and a transmission line monitor.
Figure 2:
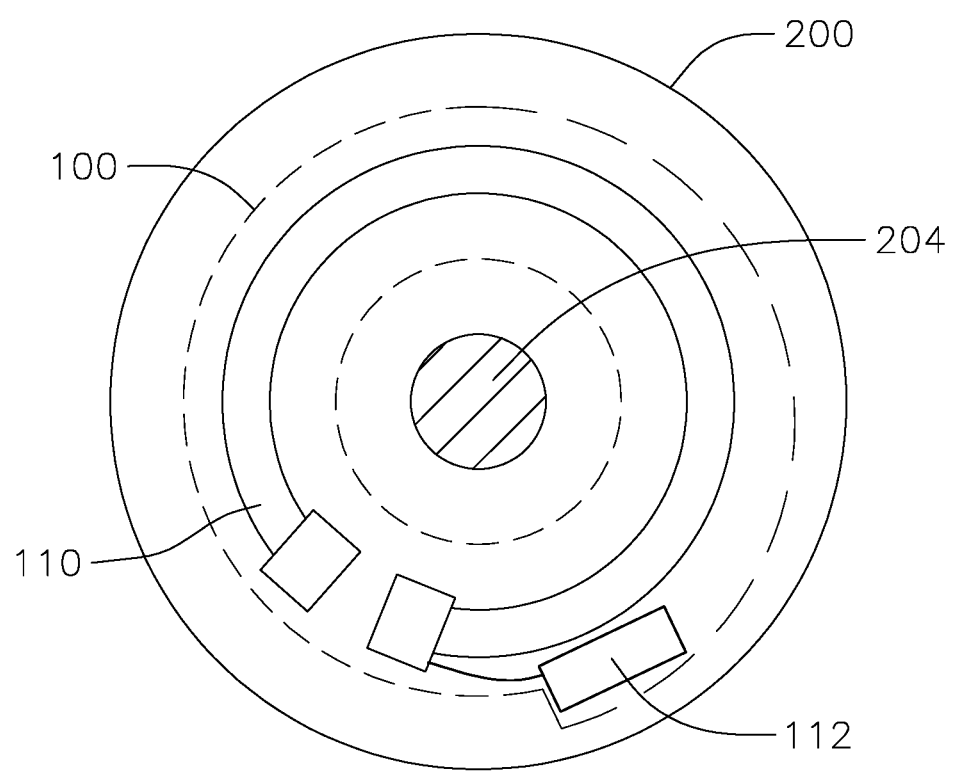
FIG. 2 is a schematic cross-sectional view of the insulator string and the insulator leakage current detector, taken along the line 2-2 of FIG. 1.

With reference to FIGS. 1 and 2, an insulator leakage current detector 100 according to one or more embodiments of the present invention is installable on a string of insulators 200. The insulator leakage current detector 100 includes a sensor 110 configured to sense a leakage current of the string of insulators 200, and a device 112 configured to transmit a signal including information sensed by the sensor 110 away from the insulator leakage current detector 100. The string of insulators 200 may be supported at one end (e.g., an upper end) by a tower (e.g., a grounded electrical tower). In one or more embodiments of the present invention, the insulator leakage current detector 100 is mounted at an end of the string of insulators 200 opposite the tower to reduce the effect of capacitive coupling. In an embodiment, the insulator leakage current detector 100 is mounted at or below a third insulator from the bottom of the string of insulators 200.

The insulators 200 may be constructed of porcelain or glass, for example. The insulators 200 may include a cap 202, which may be constructed of a material such as a metal, similar to an insulator pin 204 extending along a length of the string of insulators 200. However, the present invention is not limited thereto, and, in other embodiments, the insulators 200 may be made of any other suitable material.

The sensor 110 is configured to sense the leakage current of a string of the insulators 200. In an embodiment, the sensor 110 is a Rogowski coil. The Rogowski coil 110 obtains a derivative of the leakage current. The leakage current can then be obtained by integrating. The Rogowski coil 110 may be connected together at its ends to provide better accuracy and to maintain the Rogowski coil 110 from falling off the string of insulators 200. Alternatively, the Rogowski coil 110 may be left partially open, such as for ease of installation with a hot stick.

The sensor 110 may include a transmitting device configured to transmit a signal including information sensed by the Rogowski coil 110 away from the insulator leakage current detector 100. The transmitting device may be an RFID sensor 112. In an embodiment, the RFID sensor 112 does not require a separate power source to transmit a signal. However, the present invention is not limited thereto, and, in other embodiments, the transmitting device may include any other suitable device for transmitting a signal including information sensed by the Rogowski coil 110 away from the insulator leakage current detector 100.

According to one or more embodiments, the insulator leakage current detecting system includes a receiving device to receive leakage current information from the insulator leakage current detector 100. In an embodiment, the receiving device may be a transmission line monitor 300. For example, the transmission line monitor 300 may include a dynamic real time transmission line monitor, such as described in either of U.S. application Ser. Nos. 13/796,614 and 13/814,239, the entire disclosures of both of which are incorporated herein by reference. In an embodiment, the transmission line monitor 300 may include an antenna, a computer, a humidity monitor, a GPS clock, an iridium satellite radio, etc. In an embodiment, the transmission line monitor 300 is mounted on a conductor 302, such as a high-voltage conductor, either in the same phase or a different phase. In an embodiment, the transmission line monitor 300 is powered by a current of the conductor 302. As such, in an embodiment, the transmission line monitor 300 and the insulator leakage current detector 100 are not provided with a separate power source.

In an embodiment, the receiving device is an RFID transceiver configured to receive a signal from the insulator leakage current detector. In an embodiment, the RFID transceiver is provided in the transmission line monitor 300. The RFID transceiver may ping the RFID sensor 112 which, in response, transmits the leakage current information to the receiving device. In an embodiment, the RFID transceiver may ping the RFID sensor 112 at a rate of 100 kHz, for example. Further, in an embodiment, the RFID transceiver may ping one or more RFID sensors within a vicinity, such as within a range of 50 feet or more, of the RFID transceiver. However, in one embodiment, a communication distance between the RFID sensor and the RFID transceiver may be short, such as less than one meter. In an embodiment, the RFID transceiver may detect 60 Hz current and high-frequency current in the kHz range, which may be an indication of dry-banding and/or arcing on the surface of the insulators 200. In an embodiment, the RFID sensor 112 and the RFID transceiver may include a wireless, remotely powered RFID sensor and RFID transceiver made by Sen-Sanna Inc., such as an RFID sensor and RFID transceiver utilizing surface acoustic wave (SAW) technology. However, embodiments of the present invention are not limited thereto.

Leakage current travels up the insulator 200, over a contaminated surface of the insulator 200 and through the metal cap 202 and/or insulator pin 204. The Rogowski coil 110 detects the derivative of the leakage current and sends a signal to the RFID sensor 112. When the RFID sensor 112 is pinged by the RFID transceiver, at approximately a rate of 100 kHz, for example, the RFID sensor 112 will send a signal to the RFID transceiver including information of the derivative of the leakage current received from the Rogowski coil 110. This signal is integrated, such as by a computer of the transmission line monitor 300, to obtain the leakage current. In an embodiment, the transmission line monitor 300 may monitor for leakage current of 60 Hz and high-frequency current in the kHz range. This high-frequency current may be an indication of dry-banding and/or arcing on the surface of the insulators 200, thereby indicating the insulators 200 are contaminated and require cleaning.

In an embodiment, the transmission line monitor 300 may also include a humidity sensor to measure humidity, and can compare the leakage current signal during relatively dry periods with the leakage current during humid or wet conditions (e.g., earlier in the day and/or near the ocean). During humid periods, the leakage current signal will be higher when the insulators 200 are contaminated and require cleaning.

The transmission line monitor 300 transmits data, including the leakage current data, such as via an iridium satellite radio. The information is sent to a monitoring station or device 400 configured to receive the data, such as via an iridium satellite radio signal. The transmission line monitor 300 may be configured to transmit leakage current data at any desired frequency, such as once a day, once a week, etc.

In embodiments, a method of monitoring insulator leakage current includes a task of installing the insulator leakage current detector 100 on the insulator string. In an embodiment, the insulator leakage current detector 100 including the Rogowski coil 110 may be installed on the insulator string using a hot stick.

In embodiments of the present invention, a leakage current of the insulator string is measured using the insulator leakage current detector 100. The Rogowski coil 110 measures a derivative of the leakage current, which is sent from the RFID sensor 112 to the RFID transceiver when the RFID transceiver pings the RFID sensor 112.

In one or more embodiments of the present invention, the derivative of the leakage current is integrated to obtain the leakage current value.

In an embodiment, humidity data is obtained using a humidity sensor, and a comparison of leakage current may be made based on whether the humidity is low or high. If leakage current is greater during a period of high humidity, it may be determined that the insulator string is dirty or contaminated.

The method, in one or more embodiments, further includes a task of transmitting a signal including insulator leakage current information to a remote receiving device or station in real time or periodically. For example, insulator leakage current information may be transmitted to the remote receiving device or station once per day, once per week, or at any other desired frequency.

Although the drawings and accompanying description illustrate certain exemplary embodiments of an insulator leakage current detector, an insulator leakage current detecting system, and a method of monitoring insulator leakage current using the same, it will be apparent that the novel aspects of the present invention may also be carried out by utilizing alternative structures, sizes, shapes, and/or materials in embodiments of the present invention. Also, in other embodiments, components described above with respect to one embodiment may be included together with or interchanged with those of other embodiments. Accordingly, persons skilled in the art and technology to which this invention pertains will appreciate that alterations and changes in the described structures and methods of operation can be practiced without meaningfully departing from the principles, spirit, and scope of this invention.

What is claimed is:

1. An insulator leakage current detector mountable on an insulator string, the insulator leakage current detector comprising:
   a sensor to sense leakage current information of the insulator string; and
   a device to wirelessly send a signal including the leakage current information sensed by the sensor to a receiving device, the receiving device being at a location separate from the insulator leakage current detector,
   wherein the insulator leakage current detector does not have a power source separate from any power source of the receiving device, and
   wherein the device to send the signal including the leakage current information comprises an RFID sensor.

2. The insulator leakage current detector of claim 1, wherein the sensor comprises a Rogowski coil.

3. An insulator leakage current detecting system comprising:
   an insulator leakage current detector mountable on an insulator string and comprising:
      a sensor to sense leakage current information of the insulator string; and
      a device to wirelessly send a signal including the leakage current information sensed by the sensor; and
   a receiving device to receive the signal including the leakage current information, the receiving device being at a location separate from the insulator leakage current detector,
   wherein the insulator leakage current detector does not have a power source separate from any power source of the receiving device, and
   wherein the device to send the signal including the leakage current information comprises an RFID sensor, and the receiving device comprises an RFID transceiver.

4. The insulator leakage current detecting system of claim 3, wherein the sensor comprises a Rogowski coil.

5. The insulator leakage current detecting system of claim 3, wherein the receiving device comprises a transmission line monitor mounted on a transmission line, the transmission line being supported by the insulator string.

6. The insulator leakage current detecting system of claim 3, further comprising a remote monitoring device to which the receiving device is configured to send leakage current data.

7. An insulator leakage current detecting system comprising:
   an insulator leakage current detector mountable on an insulator string and comprising:
      a sensor to sense leakage current information of the insulator string; and
      a device to send a signal including the leakage current information sensed by the sensor; and
   a receiving device to receive the signal including the leakage current information,
   wherein the insulator leakage current detector is mounted at an end of the insulator string opposite a ground.

8. A method of detecting an insulator leakage current, the method comprising:
   providing an insulator leakage current detector on an insulator string;
   sensing leakage current information using a sensor of the insulator leakage current detector; and wirelessly transmitting a signal including the leakage current information to a receiving device, the receiving device being at a location separate from the insulator leakage current detector, wherein the insulator leakage current detector does not have a power source separate from any power source of the receiving device, and wherein transmitting the signal including the leakage current information comprises transmitting the signal from an RFID sensor to an RFID transceiver.

9. The method of claim 8, further comprising calculating a leakage current based on the leakage current information, and transmitting the calculated leakage current to a remote monitoring station.

10. The method of claim 8, wherein the leakage current information is a derivative of the leakage current, and the method further comprises integrating the derivative of the leakage current to obtain the leakage current.

11. The insulator leakage current detector of claim 1, wherein the location of the receiving device is separate from the insulator string.

12. The insulator leakage current detecting system of claim 3, wherein the location of the receiving device is separate from the insulator string.

13. The method of claim 8, wherein the location of the receiving device is separate from the insulator string.

14. A method of detecting an insulator leakage current, the method comprising:
 providing an insulator leakage current detector on an insulator string at an end of the insulator string opposite a ground;
 sensing leakage current information using a sensor of the leakage current detector; and
 transmitting a signal including the leakage current information to a receiving device.

* * * * *